United States Patent
Ma et al.

(10) Patent No.: US 9,843,300 B2
(45) Date of Patent: Dec. 12, 2017

(54) IMPEDANCE MATCHING CIRCUIT AND IMPEDANCE MATCHING METHOD

(71) Applicant: National Taiwan University of Science and Technology, Taipei (TW)

(72) Inventors: Tzyh-Ghuang Ma, Taipei (TW); Hung-Hsuan Chen, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 128 days.

(21) Appl. No.: 15/131,027

(22) Filed: Apr. 17, 2016

(65) Prior Publication Data

US 2017/0187346 A1    Jun. 29, 2017

(30) Foreign Application Priority Data

Dec. 24, 2015 (TW) .............................. 104143508 A

(51) Int. Cl.
*H03H 7/38* (2006.01)

(52) U.S. Cl.
CPC .............. *H03H 7/383* (2013.01); *H03H 7/38* (2013.01)

(58) Field of Classification Search
CPC ................................. H03H 7/38; H03H 7/383
USPC ..................................................... 333/32, 33
See application file for complete search history.

(56) References Cited

U.S. PATENT DOCUMENTS

| 6,154,179 | A | 11/2000 | Kohno |
| 2007/0195003 | A1 | 8/2007 | Deavours et al. |
| 2011/0285473 | A1 | 11/2011 | Hauer et al. |

FOREIGN PATENT DOCUMENTS

| TW | 201121143 A | 6/2011 |
| TW | I404264 B | 8/2013 |

OTHER PUBLICATIONS

A. M. Abbosh, D. James, and D. V. Thiel, "Compact UHF Antenna in Aquatic Environments for Mobile Sporting Applications," in Proc. Antennas and Propagation Society Int. Symp., IEEE, 2010, pp. 1-4.
A. G. Miquel, "UWB Antenna Design for Underwater Communications," Masters thesis, Universitat Politècnica de Catalunya, Spain, May 25, 2009.
S. G. O'Keefe and S. Perhirin, "A Passive Auto-Switching Amphibian Antenna," IEEE Transactions on Antennas and Propagation, vol. 62, No. 6, pp. 3389-3392, Jun. 2014.
H. Aumann, E. Kus, B. Cline, and N. W. Emanetoglu, "A 5.8 GHz Harmonic RF Tag for Tracking Amphibians," presented at the IEEE Int. Conf. Wireless Inform. Technol. Syst, Nov. 2012.

*Primary Examiner* — Stephen E Jones
(74) *Attorney, Agent, or Firm* — CKC & Partners Co., Ltd.

(57) ABSTRACT

An impedance matching circuit is disclosed. The impedance matching circuit adapted to an antenna includes a signal feed-in line, a phase delay line and a synthesized transmission line. The signal feed-in line receives an input signal from a wireless transceiver circuit. The phase delay line is electrically coupled between the antenna and the signal feed-in line, and delivers the input signal from the wireless transceiver circuit to the antenna. A first terminal of the synthesized transmission is electrically coupled to the signal feed-in line and the phase delay line. A second terminal of the synthesized transmission is configured to be opened. Based on the antenna operates in a first transmission medium or a second transmission medium, the input signal is transmitted to the antenna through different patterns selectively.

10 Claims, 5 Drawing Sheets

IMPEDANCE MATCHING CIRCUIT AND IMPEDANCE MATCHING METHOD

RELATED APPLICATIONS

This application claims priority to Taiwan Application Serial Number 104143508, filed Dec. 24, 2015, which is herein incorporated by reference.

BACKGROUND

Field of Invention

The present invention relates to an impedance matching circuit and a method for impedance matching. More particularly, the present invention relates to an amphibious matching circuit and an amphibious method for impedance matching.

Description of Related Art

In many fields of applications, the communication system with amphibious antenna adopted is able to keep the communication from being affected by waves and tides. For example, the amphibious antenna can be mounted on water recreation gears such as paddleboard and sailboat to wirelessly monitor the safety of people. On the other hand, the amphibious antenna can also be used for ecological monitoring of amphibians and reptiles. The amphibious antenna maintains good communications even if the target animal enters shallow water area. Still, the amphibious antenna can be configured to detect liquid leakage or find the dielectric constant of some liquid. The amphibious antenna has a variety of fields of applications.

A common design of present amphibious antenna is to utilize the characteristics of ultra-wideband antenna. Even if the antenna submerges into water, the bandwidth of the antenna still includes the operating frequency. However, due to the wide bandwidth, the antenna noise temperature raises accordingly. Another common design is to apply the dual-phenomena antenna that has modes of resonance in both air and water, but the dual-phenomena antenna suffers from process errors, three-dimensional structure and longer mechanical switching time.

SUMMARY

The invention provides an impedance matching circuit adapted to an antenna, the impedance matching circuit including: a signal feed-in line configured to receive an input signal of a wireless transceiver circuit, a phase delay line configured to feed the input signal of the wireless transceiver circuit into the antenna, and a synthesized transmission line. The phase delay line is electrically coupled to the antenna and the signal feed-in line. The synthesized transmission line includes a first terminal and a second terminal. The first terminal is electrically coupled to the signal feed-in line and the phase delay line. The second terminal is configured to be opened. The antenna operates at an operating frequency. In response to the antenna operating in a first transmission medium, the input signal is transmitted to the antenna through the signal feed-in line, the synthesized transmission line and the phase delay line. In response to the antenna operating in a second transmission medium, the synthesized transmission line has an open-circuit input impedance, and the input signal is transmitted to the antenna through the signal feed-in line and the phase delay line.

Another aspect of this invention is an impedance matching method suitable for an antenna. The impedance matching method includes following operations. A phase delay line is electrically coupled to the antenna. A synthesized transmission line is electrically coupled to the phase delay line. A signal feed-in line is electrically coupled to the phase delay line and the synthesized transmission line. An input signal of a wireless transceiver circuit is received through the signal feed-in line. In response to the antenna operating in a first transmission medium, the input signal is transmitted to the antenna through the signal feed-in line, the synthesized transmission line and the phase delay line. In response to the antenna operating in a second transmission medium, the synthesized transmission line has an open-circuit input impedance, and the input signal is transmitted to the antenna through the signal feed-in line and the phase delay line.

To conclude, since the characteristic impedance and phase angle of the synthesized transmission line vary with environments, good impedance matching can be obtained with in different media. The impedance matching circuit and the impedance matching method of this disclosure improve the total efficiency of the antenna.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
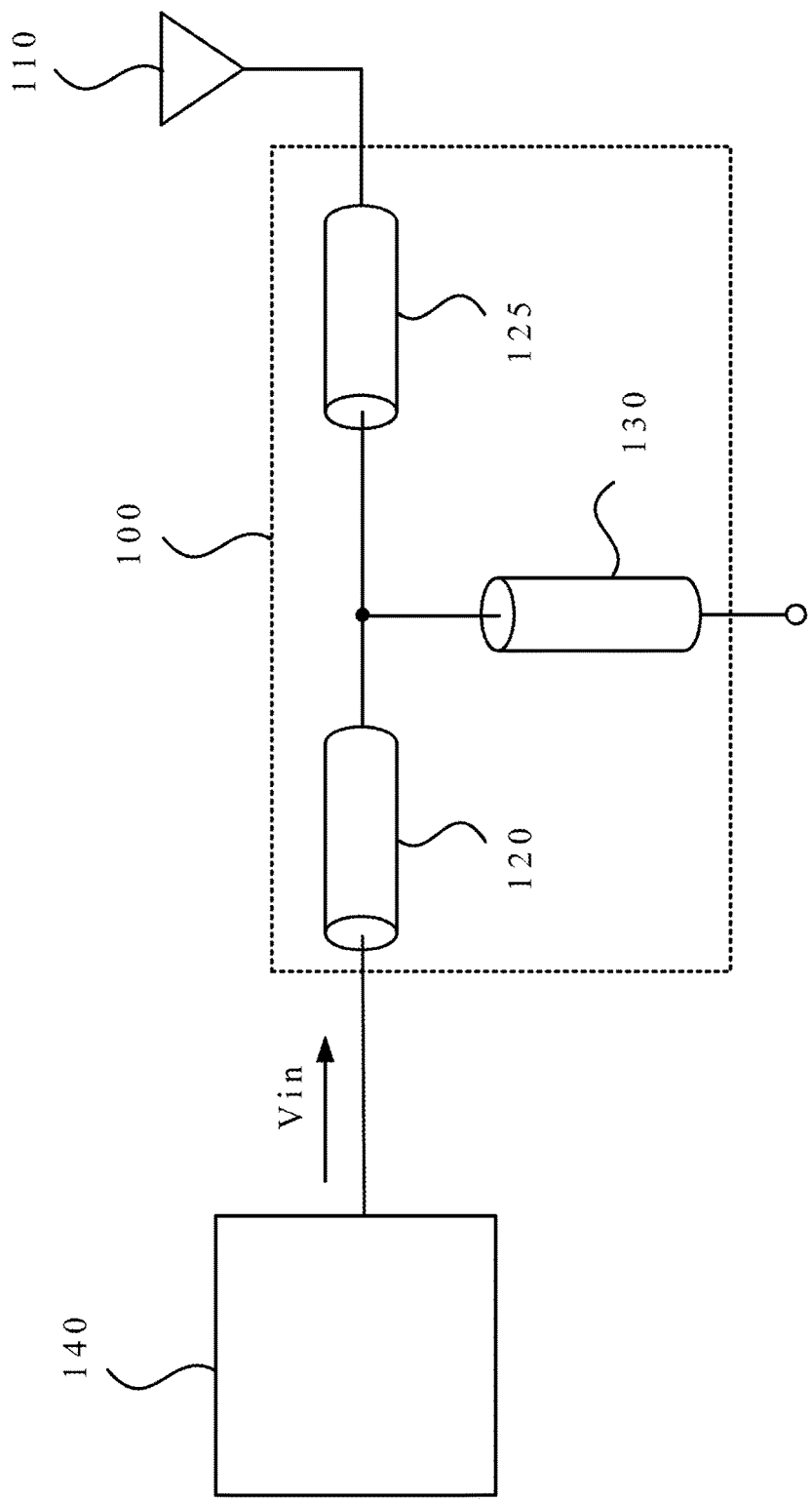
FIG. 1A is a schematic diagram of an impedance matching circuit operating in the first transmission medium according to one embodiment of the disclosure.

Reference will now be made in detail to the present embodiments of the invention, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments.

Figure 1B:
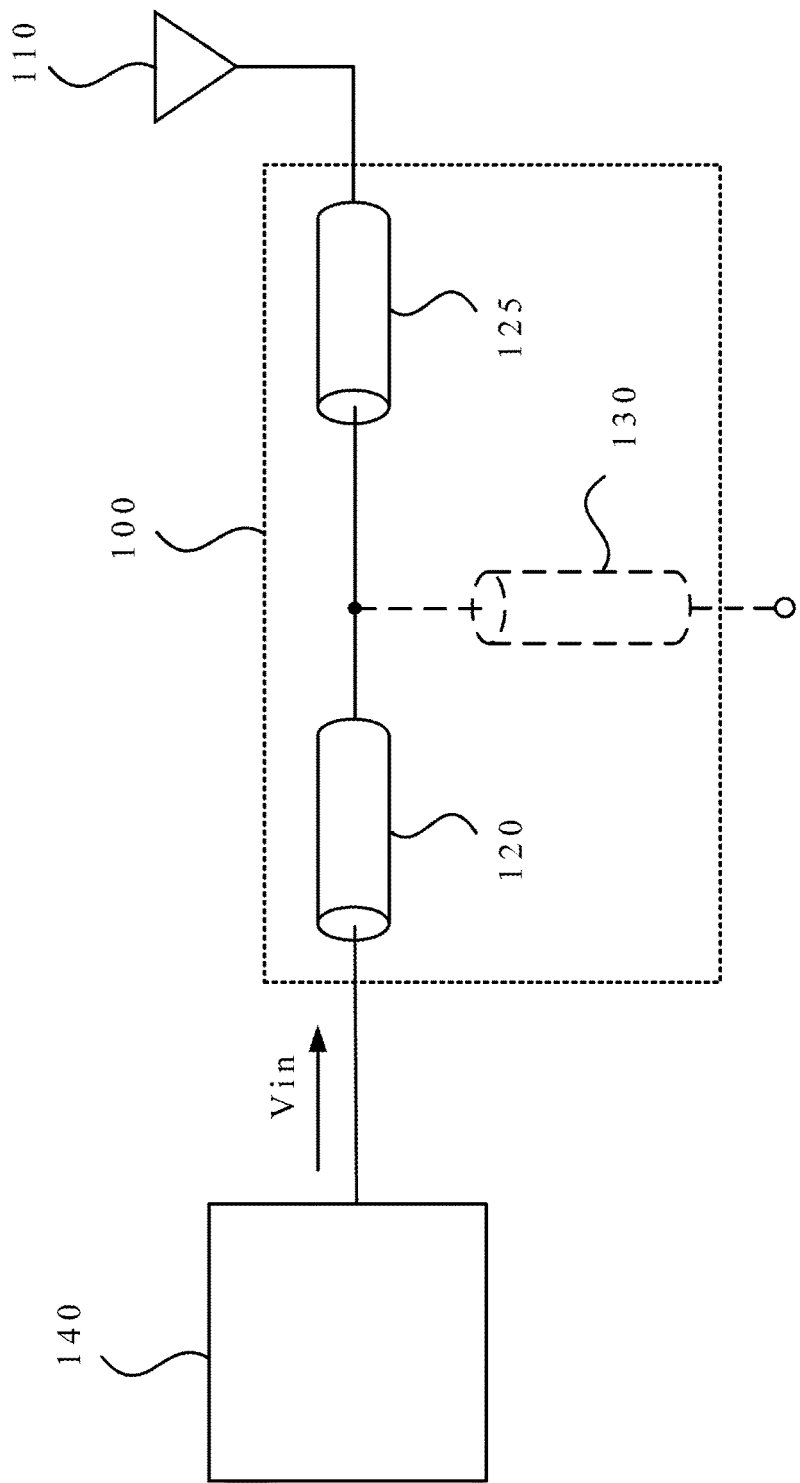
FIG. 1B is a schematic diagram of an impedance matching circuit operating in the second transmission medium according to one embodiment of the disclosure.

Reference is made to both FIG. 1A and FIG. 1B. FIG. 1A and FIG. 1B are schematic diagrams of an impedance matching circuit 100 according to one embodiment of the disclosure. The impedance matching circuit 100 is adapted to an antenna 110, and the antenna 110 can be any arbitrary planar antenna adapted to any arbitrary operating frequency. The operating frequency is set to be 433 MHZ (i.e., the ISM frequency band) for convenience; however it is not intended to limit the present disclosure.

As shown in FIG. 1A, the impedance matching circuit 100 includes a signal feed-in line 120, a phase delay line 125, and a synthesized transmission line 130. The signal feed-in line 120 is configured to receive an input signal Vin of a wireless transceiver circuit 140. The phase delay line 125 is electrically coupled to the antenna 110 and the signal feed-in line 120, and the phase delay line 125 is configured to feed the input signal Vin of the wireless transceiver circuit 140 into the antenna 110. The synthesized transmission line 130 includes a first terminal and a second terminal, wherein the first terminal is electrically coupled to the signal feed-in line 120 and the phase delay line 125.

The antenna 110 is operated at an operating frequency. In response to the antenna 110 operated in a first transmission medium, the input signal Vin is transmitted to the antenna 110 through the signal feed-in line 120, the phase delay line 125, and the synthesized transmission line 130. In response to the antenna 110 operated in a second transmission medium, the synthesized transmission line 130 has an open-circuit input impedance, and the input signal Vin is transmitted to the antenna 110 through the signal feed-in line 120 and the phase delay line 125 (e.g., without passing through the synthesized transmission line 130).

Furthermore, in FIG. 1A, the antenna 110 is operated in a first transmission medium, while in FIG. 1B, the antenna 110 is operated in a second transmission medium. The first transmission medium can be air and the second transmission medium can be water. The first and the second transmission medium can be any arbitrary transmission medium, and examples of the present disclosure are not so limited. Owing to different dielectric constants of different transmission media, the characteristic impedance of the antenna changes.

For instance, the dielectric constant of air is 1 and the dielectric constant of water is 81. Thus, even if the antenna 110 has achieved impedance matching when operated in water, the antenna 110 still has to change the characteristic impedance to maintain impedance matching at the same frequency (such as 433 MHz) when operated in air.

When the antenna 110 shown in FIG. 1A is operated in air, the input signal Vin is transmitted to the antenna 110 through the signal feed-in line 120, the phase delay line 125, and the synthesized transmission line 130. When the antenna 110 shown in FIG. 1B is operated in water, the synthesized transmission line 130 has the open-circuit input impedance (shown in dashed lines), and the input signal Vin is transmitted to the antenna 110 through the signal feed-in line 120 and the phase delay line 125 (e.g., without passing through the synthesized transmission line 130). The open-circuit input impedance implies that the impedance value approaches infinity, thus the synthesized transmission line 130 can be regarded as absent from the impedance matching circuit 100. Since the input impedance, characteristic impedance and phase angle of the synthesized transmission line 130 vary with environments, good impedance matching can be obtained in different media.

In this embodiment, the antenna 110, the phase delay line 125 and the synthesized transmission line 130 have an equivalent load impedance Zeq. When the antenna 110 is operated in the first transmission medium, the equivalent load impedance Zeq is equal to a characteristic impedance Zf of the signal feed-in line 120.

Generally speaking, if the signal is at high frequency and the load impedance is not equal to (i.e., not matching) the characteristic impedance of the transmission line, signal reflections occur at the load terminal, leading to poorer transmission efficiency. Therefore, in this embodiment, the phase delay line 125, the synthesized transmission line 130, and the antenna 110 are regarded as an antenna system. The input impedance (i.e. the load impedance) of the antenna system is the aforesaid equivalent load impedance Zeq. The equivalent load impedance Zeq is associated with and decided according to at least one of a characteristic impedance Za of the antenna 110, a characteristic impedance Z1 of the synthesized transmission line 130, a characteristic impedance Z2 of the phase delay line 125, a phase angle P1 of the synthesized transmission line 130 and/or a phase angle Pf of the phase delay line 125.

Hence, either delivering the input signal Vin from the wireless transceiver circuit 140 through the signal feed-in line 120 to the antenna system, or receiving wireless signals from the antenna 110 to the wireless transceiver circuit 140 through the signal feed-in line 120, the characteristic impedance Zf of the signal feed-in line 120 is required to be equal to the equivalent load impedance Zeq of the antenna system. In this embodiment, when the antenna 110 is operated in the first transmission medium, the equivalent load impedance Zeq is equal to the characteristic impedance Zf of the signal feed-in line 120 (for example, 50 ohms). The value of the above-mentioned characteristic impedance can be any arbitrary value, and examples of the present disclosure are not so limited.

On the other hand, in this embodiment, in response to the antenna 110 operated in the second transmission medium, an input impedance of the synthesized transmission line 130 is equivalent to the open-circuit input impedance. As mentioned above, the relative dielectric constant of water is larger than air, the characteristic impedance Z2 of the phase delay line 125 drops drastically (such as from 50 ohms to 18 ohms) in response to the antenna 110 moved from air to water. Therefore, with the open-circuited synthesized transmission line 130 in this embodiment, in order to avoid the impedance mismatch of the antenna 110 due to the presence of the phase delay line 125, the sum of a phase angle P2 of the signal feed-in line 120 and a phase angle Pf of the phase delay line 125 in the second transmission medium is designed to be 180 degrees. The signal feed-in line 120 and the phase delay line 125 can be seen as a half-wavelength transimpedance circuit, which is utilized to maintain good impedance matching of the antenna 110 in the second transmission medium.

In some embodiments, in response to the antenna 110 operated in the second transmission medium, the synthesized transmission line 130 resonates at operating frequency and the input impedance of the synthesized transmission line 130 is regarded as the open-circuit input impedance. Moreover, reference is made to FIG. 2, which is a schematic diagram of a synthesized transmission line 130 according to one embodiment of the disclosure. In this embodiment, the synthesized transmission line 130 includes a first parallel resonator 131, a series resonator 132, and a second parallel resonator 133, wherein the series resonator 132 resonates to generate a virtual ground, and the first parallel resonator 131 and the second parallel resonator 133 can be regarded as equivalent parallel resonators. The equivalent parallel resonator resonates to generate an open circuit.

The first parallel resonator 131 is electrically coupled to the signal feed-in line 120, the phase delay line 125, and the series resonator 132. The series resonator 132 is electrically coupled to the second parallel resonator 133. The first parallel resonator 131 and the second parallel resonator 133 respectively include a first capacitor C1 and a first inductor L1. The series resonator 132 includes a second capacitor C2 and a second inductor L2.

The first terminal of the first capacitor C1 of the first parallel resonator 131 is electrically coupled to the signal feed-in line 120 and the phase delay line 125, and the second terminal of the first capacitor C1 of the first parallel resonator 131 is electrically coupled to a reference voltage.

The first terminal of the first inductor L1 of the first parallel resonator 131 is electrically coupled to the first terminal of the first capacitor C1 of the first parallel resonator 131, and the second terminal of the first inductor L1 of the first parallel resonator 131 is electrically coupled to the first terminal of the second inductor L2 and the first terminal of the first inductor L1 of the second parallel resonator 133.

The first terminal of the first capacitor C1 of the second parallel resonator 133 is electrically coupled to the second terminal of the first inductor L1 of the second parallel resonator 133, and the second terminal of the first capacitor C1 of the second parallel resonator 133 is electrically coupled to the reference voltage.

The first terminal of the second capacitor C2 is electrically coupled to the second terminal of the second inductor L2, and the second terminal of the second capacitor C2 is electrically coupled to the reference voltage.

Figure 2:
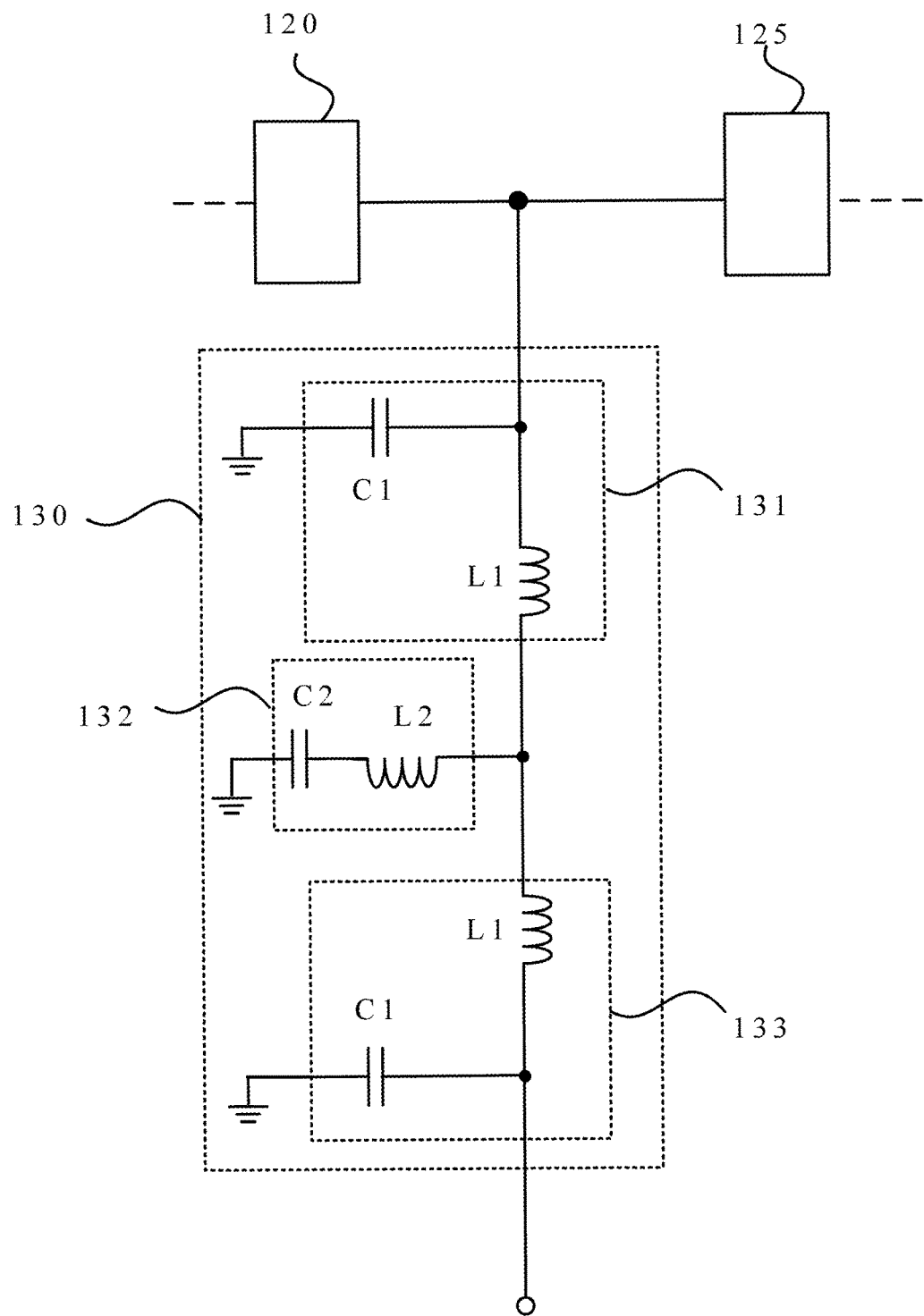
FIG. 2 is a schematic diagram of a synthesized transmission line according to one embodiment of the disclosure.

Note that, the above-mentioned reference voltage can be any arbitrary stable voltage level at low-frequency, and the reference voltage can be seen as an electrical ground, thus the reference voltage is shown as ground in FIG. 2.

Specifically, the first capacitor C1 and the second capacitor C2 have a medium variation coefficient k, making the capacitance of the first capacitor C1 and the second capacitor C2 differ in different transmission media. In response to the antenna 110 operated in the second transmission medium, the series resonator 132 has a short circuit characteristic impedance, and the first parallel resonator 131 and the second parallel resonator 133 has the open-circuit input impedance. For example, if the capacitances of the first capacitor C1 and the second capacitor C2 are 1 pF~9 pF in air, and 4.7 pF~36.5 pF in water, then the medium variation coefficient k of the first capacitor C1 and the second capacitor C2 is about 4.5.

That is, the first capacitor C1 and the second capacitor C2 of the synthesized transmission line 130 differ in different transmission media, thus the resonating frequency can be changed in different transmission medium environments, and the synthesized transmission line 130 can be made to have the open-circuit input impedance in water. The open-circuit input impedance implies that the impedance value approaches infinity, hence the synthesized transmission line 130 can be regarded as absent from the impedance matching circuit 100. With the first capacitor C1, the second capacitor C2, the first inductor L1, and the second inductor L2 of the synthesized transmission line 130 selected properly, the synthesized transmission line 130 can resonate at exactly the operating frequency of the antenna 110 (for example, 433 MHz) in the second transmission medium.

The capacitances or inductances of first capacitor C1, the second capacitor C2, the first inductor L1, and the second inductor L2 of the synthesized transmission line 130 in the first transmission medium (air) can be found in the following equations:

$$Z1(w_0) = \sqrt{\frac{L1(-2 + C2(L1 + 2L2)\omega_0^2)}{(1 - C1L1\omega_0^2)(-C2 + C1(-2 + C2(L1 + 2L2)\omega_0^2))}} \quad (1)$$

$$P1(w_0) = \cos^{-1}\left(\frac{-1 + C2(L1 + L2)\omega_0^2 - C1L1\omega_0^2(-2 + C2(L1 + 2L2)\omega_0^2)}{-1 + C2L2\omega_0^2}\right) \quad (2)$$

$$\frac{1}{\sqrt{L1C1}} = \sqrt{k}\,\omega_0 \quad (3)$$

$$\frac{1}{\sqrt{L2C2}} = \sqrt{k}\,\omega_0 \quad (4)$$

where Z1 is the characteristic impedance of the synthesized transmission line 130 in the first transmission media (air), P1 is the phase angle of the synthesized transmission line 130 in the first transmission media (air), $\omega_0$ is the operating frequency of the antenna 110, k is the medium variation coefficient of the first capacitor C1 and the second capacitor C2.

The equation (4) indicates that the series resonator 132 resonates at the frequency of $\sqrt{k}\omega_0$ in the first transmission media (air), while in the second transmission media (water), the series resonator 132 resonates at exactly the same frequency as the operating frequency $\omega_0$ of the antenna 110 due to the capacitance of the second capacitor C2 raised to kC2 thus the series resonator 132 has the short circuit characteristic impedance.

Similarly, the equation (3) indicates that the first parallel resonator 131 and 133 resonate at the frequency of $\sqrt{k}\omega_0$ in the first transmission media (air), while in the second transmission media (water), the first parallel resonator 131 and the second parallel resonator 133 resonate at exactly the same frequency as the operating frequency $\omega_0$ of the antenna 110 due to the capacitance of the first capacitor C1 raised to kC1, thus the first parallel resonator 131 and the second parallel resonator 133 have the open-circuit input impedance.

As a numeric example, but not intended to limit the present disclosure, the characteristic impedance Z1 of the synthesized transmission line 130 in the first transmission media (air) is 50 ohms, the phase angle P1 of the synthesized transmission line 130 in the first transmission media (air) is 110 degrees, the operating frequency $\omega_0$ of the antenna 110 is 433 MHz, and the medium variation coefficient k of the first capacitor C1 and the second capacitor C2 is 4.5. The capacitances or inductances of first capacitor C1, the second capacitor C2, the first inductor L1, and the second inductor L2 of the synthesized transmission line 130 in the first transmission medium (air) can be found by the above equations (1)-(4). The synthesized transmission line 130 is designed to resonate in the second transmission media (water) at exactly the same frequency (433 MHz) as the operating frequency $\omega_0$ of the antenna 110, thus the series resonator 132 has the short circuit input impedance, and the first parallel resonator 131 and the second parallel resonator 133 have the open-circuit input impedance.

No matter viewing from the first or second terminal of the synthesized transmission line 130, the input impedances are both open-circuit input impedance in the second transmission medium. Since the characteristic impedance and phase angle of the synthesized transmission line vary with environments, good impedance matching can be obtained in different media. The impedance matching circuit and the impedance matching method of this disclosure improve the total efficiency of the antenna in both media.

Figure 3:
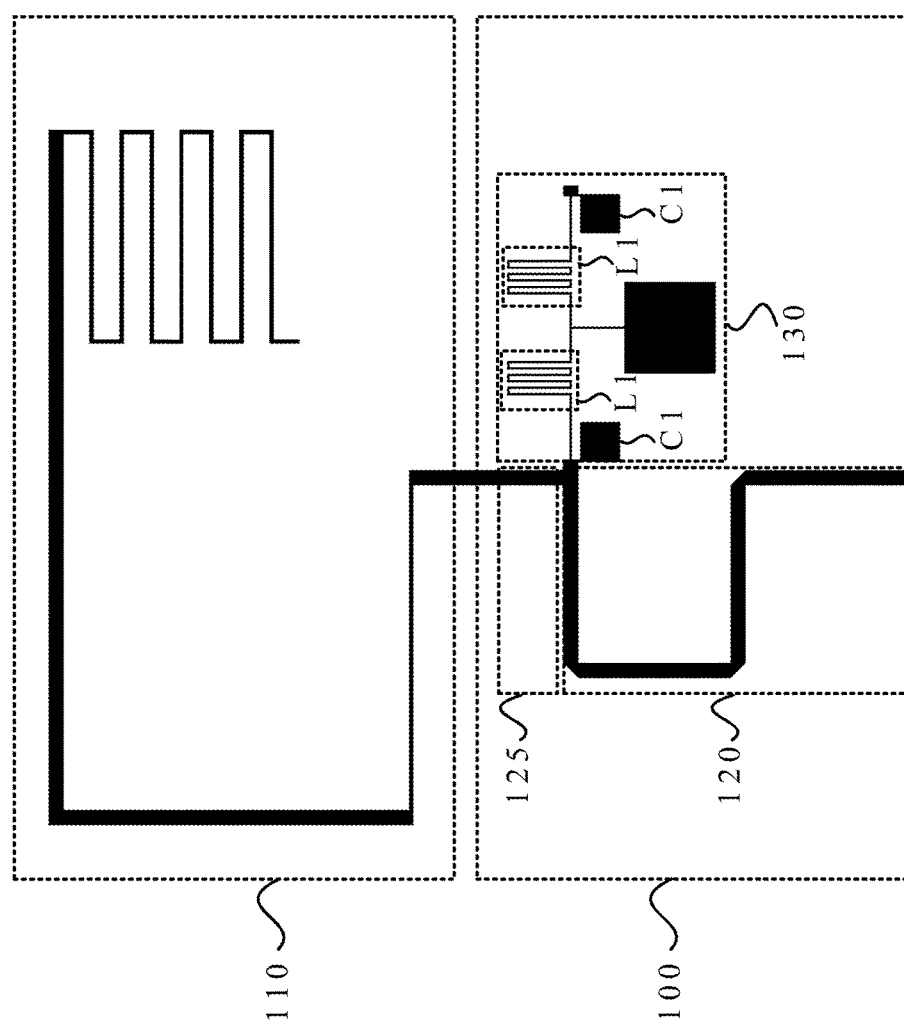
FIG. 3 is a circuit layout diagram of the impedance matching circuit shown in FIG. 1A.

Reference is made to FIG. 3, which is a circuit layout diagram of the impedance matching circuit shown in FIG. 1A. As shown in FIG. 3, the signal feed-in line 120 adopts a serpentine routing in this embodiment to increase the phase angle Pf in the second transmission media (to make the sum of the phase angle Pf and the phase angle P2 of the phase delay line 125 be the aforesaid 180 degrees), namely to increase the electrical length of the signal feed-in line 120 in the second transmission media.

On the other hand, the inductances of the first inductor L1 of the first parallel resonator 131 and the second parallel resonator 133 of the synthesized transmission line 130 come respectively from two serpentine routings, and the capacitance of the first capacitor C1 comes from parallel plate electrodes between circuit boards. In some embodiments, the synthesized transmission line 130 can also be realized in integrated circuit processes such as integrated passive device (IPD) process, and the antenna can be configured to detect liquid leakage in some specific environments (for example, factory) or find the dielectric constant of some liquid.

Figure 4:
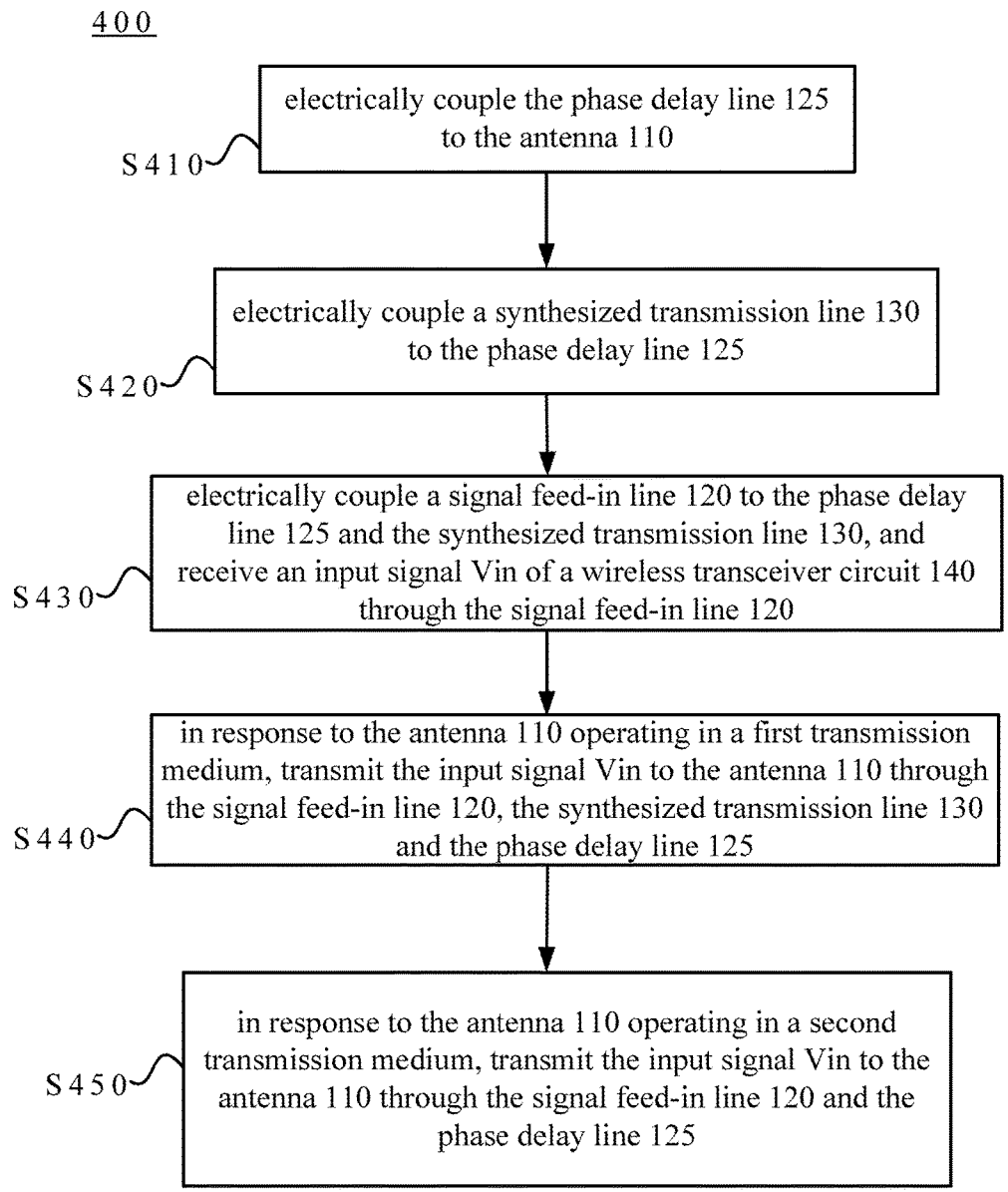
FIG. 4 is a flow chart of an impedance matching method according to one embodiment of the disclosure.

Another aspect of this invention is an impedance matching method for suitable for an antenna. Reference is made to FIG. 4, which is a flow chart of an impedance matching method 400 according to one embodiment of the disclosure. The impedance matching method 400 can be applied to the impedance matching circuit 100 in previous embodiments, or other equivalent impedance matching circuits.

Operation S410 of the impedance matching method 400 is performed to electrically couple the phase delay line 125 to the antenna 110.

Operation S420 of the impedance matching method 400 is performed to electrically couple a synthesized transmission line 130 to the phase delay line 125.

Operation S430 of the impedance matching method 400 is performed to electrically couple a signal feed-in line 120 to the phase delay line 125 and the synthesized transmission line 130, and receive an input signal Vin of a wireless transceiver circuit 140 through the signal feed-in line 120.

In response to the antenna 110 operated in a first transmission medium, operation S440 of impedance matching method 400 is performed to transmit the input signal Vin to the antenna 110 through the signal feed-in line 120, the synthesized transmission line 130 and the phase delay line 125.

In response to the antenna 110 operated in a second transmission medium, operation S450 of impedance matching method 400 is performed to transmit the input signal Vin to the antenna 110 through the signal feed-in line 120 and the phase delay line 125 (e.g., without passing through the synthesized transmission line 130). The input impedance of the synthesized transmission line 130 equals to the open-circuit input impedance when the antenna 110 is operated in the second transmission medium.

In some embodiments, the antenna 110, the phase delay line 125 and the synthesized transmission line 130 have an equivalent load impedance Zeq. When the antenna 110 is operated in the first transmission medium, the equivalent load impedance Zeq is equal to a characteristic impedance Zf of the signal feed-in line 120.

To conclude, since the characteristic impedance and phase angle of the synthesized transmission line vary with environments, good impedance matching can be obtained with in different media. The impedance matching circuit and the impedance matching method of this disclosure improve the total efficiency of the antenna.

Although the present invention has been described in considerable detail with reference to certain embodiments thereof, other embodiments are possible. Therefore, the spirit and scope of the appended claims should not be limited to the description of the embodiments contained herein.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention, and the scope thereof is determined by the claims that follow.

What is claimed is:

1. An impedance matching circuit, suitable for an antenna, the impedance matching circuit comprising:
   a signal feed-in line configured to receive an input signal of a wireless transceiver circuit;
   a phase delay line electrically coupled between the antenna and the signal feed-in line, the phase delay line being configured to feed the input signal of the wireless transceiver circuit to the antenna; and
   a synthesized transmission line, comprising:
      a first terminal electrically coupled to the signal feed-in line and the phase delay line; and
      a second terminal configured to be opened;
   wherein the antenna is operated at an operating frequency,
   in response to the antenna being operated in a first transmission medium, the input signal is transmitted to the antenna through the signal feed-in line, the synthesized transmission line and the phase delay line, and
   in response to the antenna being operated in a second transmission medium, the synthesized transmission line is configured to have an open-circuit input impedance, and the input signal is transmitted to the antenna through the signal feed-in line and the phase delay line.

2. The impedance matching circuit of claim 1, wherein the first transmission medium is air and the second transmission medium is water.

3. The impedance matching circuit of claim 1, wherein the antenna, the phase delay line and the synthesized transmission line have an equivalent load impedance, and in response to the antenna operating in the first transmission medium, the equivalent load impedance is equal to a characteristic impedance of the signal feed-in line.

4. The impedance matching circuit of claim 3, wherein in response to the antenna operating in the second transmission medium, the synthesized transmission line is configured to have the open-circuit input impedance, and the sum of a phase angle of the signal feed-in line and another phase angle of the phase delay line is 180 degrees.

5. The impedance matching circuit of claim 4, wherein in response to the antenna operating in the second transmission medium, the synthesized transmission line resonates at the operating frequency, such that the synthesized transmission line is configured to have the open-circuit input impedance.

6. The impedance matching circuit of claim 5, wherein the synthesized transmission line further comprises:
   a serial resonator;
   a first parallel resonator electrically coupled to the signal feed-in line, the phase delay line and the series resonator; and
   a second parallel resonator electrically coupled to the series resonator;
   wherein in response to the antenna operating in the second transmission medium, the series resonator is configured to have a short circuit characteristic impedance, and the first parallel resonator and the second parallel resonator are configured to have the open-circuit input impedance.

7. The impedance matching circuit of claim 6, wherein each of the first parallel resonator and the second parallel resonator comprises a first capacitor and a first inductor, the serial resonator comprises a second capacitor and a second inductor, a first terminal of the first capacitor of the first parallel resonator is electrically coupled to the signal feed-in line and the phase delay line, a second terminal of the first capacitor of the first parallel resonator is electrically coupled to a reference voltage, a first terminal of the first inductor of the first parallel resonator is electrically coupled to the first terminal of the first capacitor of the first parallel resonator, a second terminal of the first inductor of the first parallel resonator is electrically coupled to a first terminal of the second inductor and a first terminal of the first capacitor of the second parallel resonator, a second terminal of the second capacitor is electrically coupled to the reference voltage, a second terminal of the first inductor of the second parallel resonator is electrically coupled to a first terminal of the first capacitor of the second parallel resonator, a second terminal of the first capacitor of the second parallel resonator is electrically coupled to the reference voltage.

8. The impedance matching circuit of claim 7, wherein each of the first capacitor and the second capacitor has a medium variation coefficient, such that capacitance values of the first capacitor and the second capacitor in the first transmission medium are different from capacitance values of the first capacitor and the second capacitor in the second transmission medium.

9. An impedance matching method, suitable for an antenna, the impedance matching method comprising:
   electrically coupling a phase delay line to the antenna;
   electrically coupling a synthesized transmission line to the phase delay line;
   electrically coupling a signal feed-in line to the phase delay line and the synthesized transmission line;
   receiving an input signal of a wireless transceiver circuit through the signal feed-in line;
   in response to the antenna operating in a first transmission medium, transmitting the input signal to the antenna through the signal feed-in line, synthesized transmission line, and the phase delay line; and
   in response to the antenna operating in a second transmission medium, transmitting the input signal to the antenna through the signal feed-in line and the phase delay line, wherein the synthesized transmission line has an open-circuit input impedance while the antenna operating in the second transmission medium.

10. The method for impedance matching of claim 9, wherein the antenna, the phase delay line and the synthesized transmission line have an equivalent load impedance, and in response to the antenna operating in the first transmission medium, the equivalent load impedance is equal to a characteristic impedance of the signal feed-in line.

* * * * *